United States Patent
Yoo (10) Patent No.: US 9,196,618 B2
(45) Date of Patent: Nov. 24, 2015

(54) SEMICONDUCTOR DEVICE AND METHOD OF MANUFACTURING THE SAME

(75) Inventor: Min Soo Yoo, Gyeonggi-do (KR)

(73) Assignee: HYNIX SEMICONDUCTOR INC., Icheon (KR)

( * ) Notice: Subject to any disclaimer, the term of this patent is extended or adjusted under 35 U.S.C. 154(b) by 734 days.

(21) Appl. No.: 13/290,745

(22) Filed: Nov. 7, 2011

(65) Prior Publication Data

US 2012/0211830 A1 Aug. 23, 2012

(30) Foreign Application Priority Data

Feb. 22, 2011 (KR) .......................... 10-2011-0015619

(51) Int. Cl.
- H01L 29/78 (2006.01)
- H01L 27/108 (2006.01)
- H01L 21/768 (2006.01)
- H01L 21/762 (2006.01)

(52) U.S. Cl.
CPC .... *H01L 27/10855* (2013.01); *H01L 21/76224* (2013.01); *H01L 21/76801* (2013.01); *H01L 21/76897* (2013.01); *H01L 27/10876* (2013.01); *H01L 27/10814* (2013.01)

(58) Field of Classification Search
CPC .............. H01L 29/7813; H01L 29/42368; H01L 29/407; H01L 29/41766; H01L 29/4236; H01L 27/088

USPC .............................................. 257/334, E27.06
See application file for complete search history.

(56) References Cited

U.S. PATENT DOCUMENTS

| | | | |
|---|---|---|---|
| 8,357,600 B2* | 1/2013 | Shin et al. | 438/586 |
| 2008/0121961 A1 | 5/2008 | Schloesser | |
| 2008/0179647 A1 | 7/2008 | Seo et al. | |
| 2008/0283957 A1 | 11/2008 | Kang et al. | |
| 2008/0284029 A1 | 11/2008 | Kim et al. | |
| 2010/0200948 A1 | 8/2010 | Kim | |
| 2011/0037111 A1* | 2/2011 | Kim et al. | 257/302 |

FOREIGN PATENT DOCUMENTS

| | | |
|---|---|---|
| JP | 2008-078645 A | 4/2008 |
| JP | 2008-187178 A | 8/2008 |
| JP | 2008-288597 A | 11/2008 |
| KR | 100827515 B1 | 4/2008 |
| KR | 1020100091482 A | 8/2010 |
| KR | 1020110011426 A | 2/2011 |
| KR | 1020110016218 A | 2/2011 |

* cited by examiner

Primary Examiner — Monica D Harrison (57) ABSTRACT

A semiconductor device and a method of fabricating the same are provided, in which a full overlap between a storage node contact and an active region to solve an overlay in an etching process and an etching width of a storage node is increased to improve a processing margin. The semiconductor device includes a main gate and a device isolation structure disposed in a semiconductor device, an isolation pattern disposed over the device isolation structure, and contact plugs disposed at each side of the isolation pattern.

14 Claims, 9 Drawing Sheets

SEMICONDUCTOR DEVICE AND METHOD OF MANUFACTURING THE SAME

CROSS-REFERENCES TO RELATED APPLICATION

This application claims priority under 35 U.S.C. 119(a) to Korean application number 10-2011-0015619, filed on 22 Feb. 2011, in the Korean Patent Office, which is incorporated by reference in its entirety to this application.

BACKGROUND OF THE INVENTION

1. Technical Field

Embodiments of the present invention relate to a semiconductor device and a method of manufacturing the same and, more particularly, to a semiconductor device including a buried gate and a storage node contact and a method of manufacturing the same.

2. Related Art

Recently, although demand for large capacity of semiconductor memory devices, particularly dynamic random access memories (DRAMs), has increased, increases in capacity of DRAMs will likely reach the limit in the near future as the DRAM technology goes down below 30 nm due to the difficulty of making functioning DRAM cells with the feature size that is significantly less than 30 nm. Thus, much research effort has been made in trying to reduce the memory cell size in order to fit more memory cells in the same area. One area of this effort has been to coming up with more efficient cell layout, e.g., changing the layout from a conventional 8F2 into 6F2, where "F" refers to the feature size. The feature size typically denotes the smallest pattern size used to fabricate a given semiconductor chip.

Another method used to squeeze a greater number of the memory cells into the same chip area and obtain increased storage capacity was employing a recess gate structure that has a gate formed in a recess of a substrate. A channel region is formed along a curved recess surface, instead of a conventional planar gate structure, which has a horizontal channel region.

A buried gate structure is yet another method used to scale down the DRAM memory cell, where the gate is buried in a recess in the substrate. The whole gate is formed below the surface of in a semiconductor substrate to obtain a channel that has a longer length and a wider width in order to reduce parasitic capacitance, e.g., between a gate (a word line) and a bit line.

One challenge of implementing the buried gate structure technology is the relatively small contact area between a storage node contact and an active region. This small contact area results in relatively high contact resistance.

SUMMARY

Embodiments of the present invention are directed to providing a semiconductor device having relatively low contact resistance. In an embodiment, an isolation pattern is formed on a device isolation structure and contact plugs are formed at sides of the isolation pattern so that a full overlap between a storage node contact and an active region is provided to solve an overlay in an etching process, and an etching width of a storage node is increased to improve processing margin.

According to one aspect of an exemplary embodiment, a semiconductor device includes a main gate and a device isolation structure disposed in a semiconductor substrate, an isolation pattern disposed on the device isolation structure, and contact plugs disposed at sides of the isolation pattern. The isolation pattern is formed on the device isolation structure and the contact plugs are formed at sides of the isolation pattern so that a full overlap between a storage node contact and an active region is provided to solve an overlay in an etching process and an etching line width of a storage electrode to provide a processing margin.

The device isolation structure may include at least one of an isolation gate disposed to be adjacent to the main gate in the semiconductor substrate and a device isolation film including an insulating layer buried within a trench in which the semiconductor substrate is etched.

The isolation pattern may include an insulating layer having a different etch selectivity from an oxide layer. The isolation pattern may include a nitride layer, a silicon oxynitride layer, and an amorphous carbon layer.

Each of the main gate and the isolation gate may include a buried gate which includes a recess having a predetermined depth formed in the semiconductor substrate, a gate conductive layer buried in a lower portion of the recess, and a capping layer formed on the gate conductive layer within the recess.

The isolation pattern may be formed so that a lower portion of the isolation pattern is buried within an upper portion of the recess to prevent the isolation pattern from collapsing.

In addition, the main gate and the isolation gate may be formed so that two main gates and one isolation gate are repeatedly disposed.

The semiconductor device may further include a bit line contact disposed on a bit line contact region between the two main gates and a bit line disposed on the bit line contact.

The contact plugs may include a storage node contact plug.

According to another aspect of another exemplary embodiment, a semiconductor device includes an active region formed in a line type in a semiconductor substrate, a main gate obliquely extending to the active region, an isolation gate in the semiconductor substrate, an isolation pattern of a line type disposed on the isolation gate, and contact plugs extending along both sides of the isolation pattern. The isolation pattern is formed on a device isolation structure and contact plugs are formed at both sides of the isolation pattern. Thereby, a full overlap between a storage node contact and the active region is provided to improve an overlay in an etching process and an etching line width of a storage node is increased to improve a processing margin.

The main gate and the isolation gate may be formed so that two main gates and one isolation gate are alternatively disposed.

The semiconductor device may further include a bit line contact plug between the two main gates.

The semiconductor device may further include a bit line of a line type disposed on the bit line contact plug and extending to cross the main gate.

The bit line may vertically cross the main gate and the contact plug may include a storage node contact plug.

According to another aspect of another exemplary embodiment, a method of manufacturing a semiconductor device includes forming a main gate and a device isolation structure in a semiconductor substrate, forming an isolation pattern on the device isolation structure, and forming contact plugs at the both sides of the isolation pattern. The isolation pattern is formed on the device isolation structure and contact plugs are formed at both sides of the isolation pattern. Thereby, a full overlap between a storage node contact and an active region is provided to improve an overlay in an etching process and an etching line width of a storage node is increased to improve a processing margin.

The forming a device isolation structure may include at least one of forming an isolation gate disposed to be adjacent to the main gate in a semiconductor substrate and forming a device isolation film including an insulating layer buried in a trench in which the semiconductor substrate is etched.

The forming an isolation pattern may include forming an interlayer dielectric layer on the semiconductor substrate, etching the interlayer dielectric layer by bordering the isolation gate, depositing an isolation pattern layer on the whole surface of the semiconductor substrate including an etched interlayer dielectric layer, etching back the isolation pattern layer so that the isolation pattern remains on a sidewall of the interlayer dielectric layer, and removing the interlayer dielectric layer.

The forming a main gate and an isolation gate may include forming a recess having a predetermined depth in the semiconductor substrate, burying a gate conductive layer in a lower portion of the recess, and burying a capping layer on the gate conductive layer within the recess.

The isolation pattern may be formed so that a lower portion of the isolation pattern is buried within an upper portion of the recess.

The method may further include etching the capping layer to a predetermined depth and forming an isolation pattern layer on the semiconductor substrate including an etched capping layer.

The forming a contact plug may include forming an interlayer dielectric layer on the semiconductor substrate including the isolation pattern, etching the interlayer dielectric layer by bordering the main gate to form a contact hole, depositing a conductive material on the whole surface of the semiconductor substrate including the contact hole, and planarization-etching the conductive material on the interlayer dielectric layer.

The isolation pattern may include an insulating layer having a different etch selectivity from an oxide layer. The isolation pattern may include a silicon nitride layer, a silicon oxynitride layer or an amorphous carbon layer.

The forming a main gate and an isolation gate may include forming two main gates and one isolation gate to be disposed alternatively.

The method may further include forming a bit line contact on a bit line contact region between the two main gates and forming a bit line on the bit line contact.

The contact plug may include a storage node contact plug.

According to another aspect of another exemplary embodiment, a method of manufacturing a semiconductor device includes forming an active region of a line type in a semiconductor substrate, forming a main gate obliquely extending to the active region and an isolation gate in the semiconductor substrate, forming an isolation pattern of a line pattern on the isolation gate, and forming a contact plug extending along both edges of the isolation pattern.

The forming the main gate and the isolation gate may include forming two main gates and one isolation gate to be alternatingly disposed.

The method may further include forming a contact plug between the two main gates.

The method may further include forming a bit line of a line type disposed on the bit line contact plug to be connected to the bit line contact plug and extending to cross the main gate.

The bit line may be formed to vertically cross the main gate.

The contact plug may include a storage node contact plug.

These and other features, aspects, and embodiments are described below in the section entitled "DESCRIPTION OF EXEMPLARY EMBODIMENT."

BRIEF DESCRIPTION OF THE DRAWINGS

The above and other aspects, features, and other advantages of the subject matter of the present disclosure will be more clearly understood from the following detailed description taken in conjunction with the accompanying drawings, in which.

DESCRIPTION OF EXEMPLARY EMBODIMENT

Exemplary embodiments are described herein with reference to cross-sectional illustrations that are schematic illustrations of exemplary embodiments (and intermediate structures). As such, variations from the shapes of the illustrations that result, for example, from manufacturing techniques and/or tolerances, are to be expected. Thus, exemplary embodiments should not be construed as limited to the particular shapes of regions illustrated herein, but may also include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

A semiconductor device and a method of manufacturing the same according to an exemplary embodiment of the present invention will be described with reference to the accompanying drawings.

Figure 1:
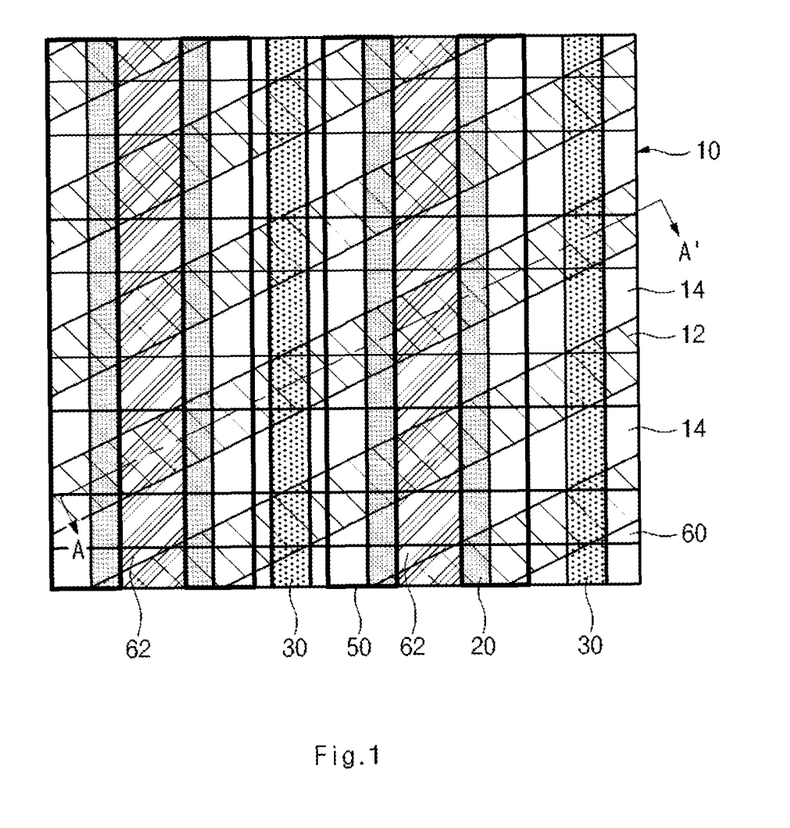
FIG. 1 is a plan view of a semiconductor device according to an embodiment of the present invention.

FIG. 1 is a plan view of a semiconductor device according to an embodiment of the present invention. An active region 12 is formed as a line type pattern, e.g., extending at an angle with respect to a bit line. A device isolation film of a line type is formed in a remaining region of a semiconductor substrate 10, other than the active region 12, to define the active region 12. A configuration of the active region 12 is not limited to the line type, but other configurations of the active region are applicable as described later.

The bit line 60 is formed as a line type pattern to pass across the active region 12 along a first direction, which forms an acute angle with respect to the active region 12. A main gate 20 (also referred to as "cell gate") is formed as a line type pattern extending along a second direction perpendicular to the first direction. An isolation gate 30 (also referred to as "isolation pattern") is formed as a line type pattern between a neighboring pair of the main gates so that the isolation pattern extends along the first direction. In an embodiment, a plurality of main gates 20 and a plurality of isolation gates 30 may be spaced apart at a constant distance. For example, they may be formed in a line-and-space pattern where the line pattern has a line width of "1," and the space pattern also has a line width of "1."

Figure 2:
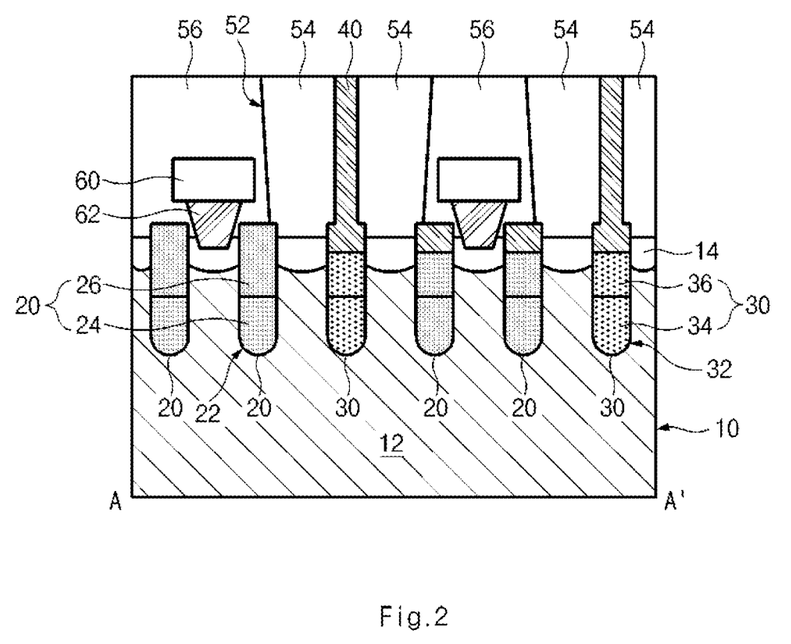
FIG. 2 is a cross-sectional view of the semiconductor device taken along the line A-A' of FIG. 1.

An isolation pattern 40 (see FIG. 2) is formed as a line type on the isolation gate 30. Contact plugs 50 are formed at both sides of the isolation pattern 40. The contact plugs 50 may include a storage node contact plug. FIG. 2 is a cross-sectional view of the semiconductor device taken along line A-A' of FIG. 1. The active region 12 is formed in the semiconductor substrate 10 and two main gates 20 and one isolation gate 30 are repeatedly formed, where each of these gates is spaced apart at a substantially constant distance from the adjacent gate according to an embodiment of the present invention. The main gates 20 and the isolation gates 30 may be formed as buried gates in which the gate is buried within the semiconductor substrate 10. Each of the main gates 20 and the isolation gates 30 may include a recess 22 or 32 having a predetermined depth formed in the semiconductor substrate 10; a gate conductive layer 24 or 34 buried in a lower portion of the recess 22 or 32; and a capping layer 26 or 36 over the gate conductive layer 24 or 34 within the recess 22 or 32. The gate conductive layer 24 or 34 includes a metal such as tungsten (W) or titanium (Ti). The capping layer 26 or 36 includes an insulating material such as a nitride layer or an oxide layer.

Here, the main gates 20 serve as word lines of the semiconductor device and the isolation gates 30, having the same structure as the main gates 20, serve to isolate cells without actually operating as a gate. The isolation gates 30 may be grounded by connecting to the back bias voltage Vbb. In addition, the isolation gate 30 may be replaced by a device isolation film or a structure in which a gate is buried within a device isolation film, as described later (see FIG. 15).

Figure 14:
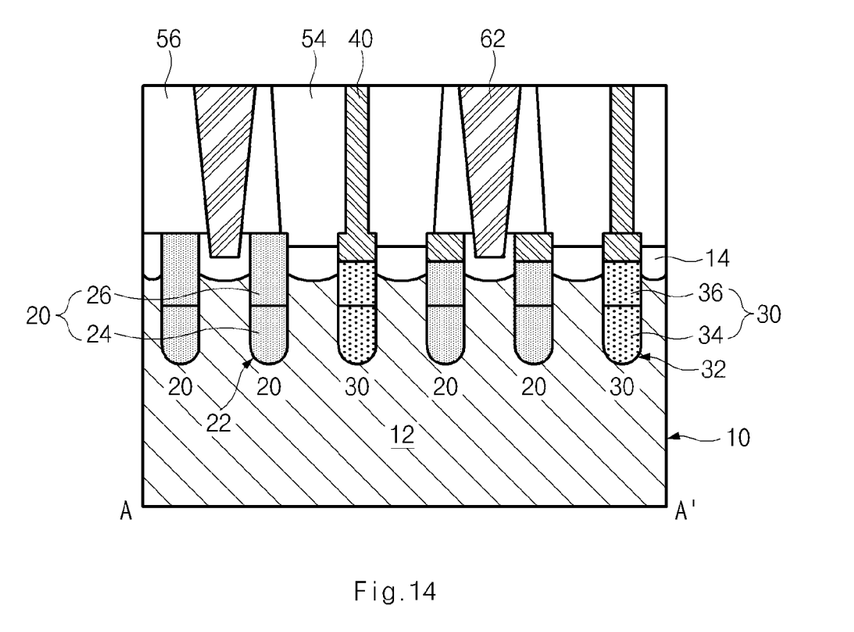

Junction regions are formed in regions of the active region 12 between the main gate 20 and the isolation gate 30, and between the main gates 20. A junction region between two main gates 20 may be a bit line contact region and a junction region between a main gate 20 and an isolation gate 30 may be a storage node contact region, but the present invention is not limited thereto. As a result, a bit line plug 62 and a bit line 60 may be formed on a bit line contact region, and a storage node contact plug 54 and a capacitor (not shown) may be formed in a storage node contact region. At this time, the bit line contact plug 62 may be formed to have a lower surface level than the storage node contact plugs 54, as shown in FIG. 2, or to have a higher surface level than the storage node contact plugs 54, as shown in FIG. 14.

In addition, an isolation pattern 40 is formed on the isolation gate 30. The isolation pattern 40, which may be formed in the same line type as the isolation gates 30, is disposed over the isolation gates 30, as shown in FIG. 2. The isolation pattern 40 may include a material having a different etch selectivity from an oxide layer and may include a silicon nitride layer, a silicon oxynitride (SiON) layer, or an amorphous carbon layer. The isolation pattern 40 is disposed between two contact plugs 54. That is, the contact plugs 54 are disposed at sides of the isolation pattern 40. A contact plug 54 may be the storage node contact plug.

The isolation pattern 40 extends under the surface of the semiconductor substrate 10 so that a lower portion thereof partially extends into the upper portion of the recess 32 and couples to the buried isolation gate 30. As a result, even when the isolation pattern 40 is formed with a high aspect ratio (e.g., an aspect ratio of 3, 5, 7, or higher), collapse of the isolation pattern 40 can be prevented than a case that the isolation pattern 40 is formed over the semiconductor substrate 10. In an embodiment, the isolation pattern 40 has substantially higher aspect ratio than the isolation gate 30.

In the semiconductor device having the above-described structure, two storage node contact plugs 54 are formed at the same time using a single etching and deposition process because the isolation pattern 40, previously formed, serves to isolate the two storage node contact plugs 54 according to an embodiment of the present invention. As a result, full overlap between a storage node contact and the active region is provided, thus increasing a processing margin. Also, a misalignment issue, which may occur in the course of forming a storage node contact hole, can be solved, and a contact area size between a storage node and a junction can be increased.

FIGS. 3 to 14 are cross-sectional views, which are taken along line A-A' of FIG. 1 and illustrate a method of manufacturing the semiconductor device according to one exemplary embodiment. Hereinafter, a method of manufacturing the semiconductor device having the above-described structure will be described with reference to FIGS. 3 to 14.

Figure 3:
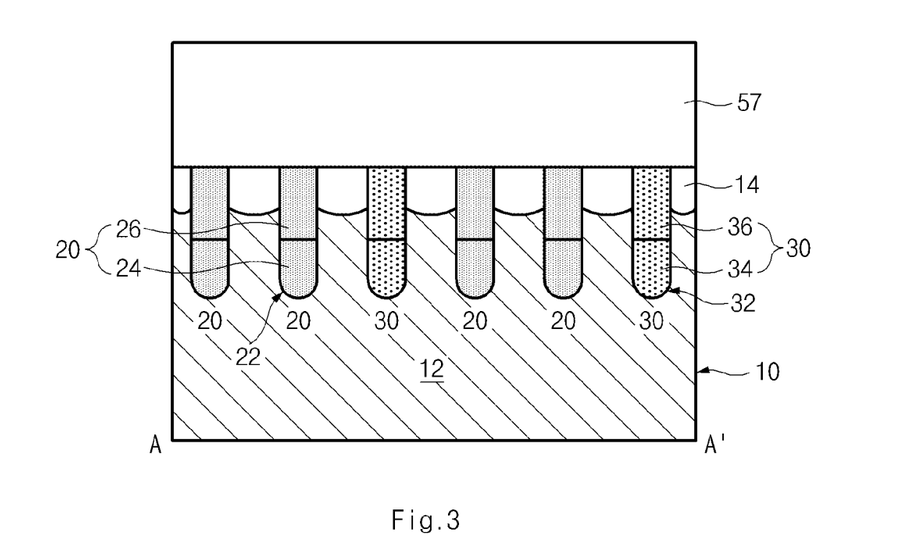
FIGS. 3 through 14 are cross-sectional views illustrating a method of manufacturing the semiconductor device according to an embodiment of the present invention, which are taken along the line A-A'.

Referring to FIG. 3, the main gate 20 and the isolation gate 30 are formed to be buried within the semiconductor substrate 10. Specifically, the recesses 22 and 32 are formed to a predetermined depth in the semiconductor substrate 10. A conductive material including W or Ti is deposited in the recesses 22 and 32 and then etched back so that the conductive material remains in the lower portions of the recesses 22 and 32, thereby forming the gate conductive layers 24 and 34. Next, the capping layers 26 and 36, including an insulating material such as a nitride layer or an oxide layer, are formed on the gate conductive layers 24 and 34 within the recesses 22 and 32.

An ion implantation process is performed to form the junction regions 14 between the gates 20 and 30 of the semiconductor substrate 10, and an interlayer dielectric layer 57 including an oxide layer is formed to a predetermined thickness on the semiconductor substrate 10.

As an alternative to the isolation gate 30, even though not shown in the drawings, a device isolation film of a line type may be formed using a shallow trench isolation (STI) process to define the active region 12 of a line type, as shown in FIG. 1.

The STI process of forming the device isolation layer will be described in further detail. First, a sidewall oxide layer is formed on an inner wall of a trench through an oxidation process. The sidewall oxide layer serves to treat lattice defects of a surface of the semiconductor substrate, which is exposed by forming the trench. A liner nitride layer and a liner oxide layer are formed on a surface of the trench. The liner nitride layer prevents an oxidization of the inner wall of the trench and suppress occurrence of stress in the subsequent process. The liner oxide layer is configured to lower the stress exerted on the inside of the trench, which occurs when an insulating material is deposited in the trench, or solves non-uniformity, which results from a deposition rate difference caused by a material difference between the semiconductor substrate exposed by the trench and a pad nitride layer pattern.

Next, an insulating material for device isolation is formed over the whole surface of the semiconductor substrate 10, including the trench in which the liner oxide layer is formed. The insulating layer for device isolation includes an oxide layer. For example, the insulating layer for device isolation may include high density plasma (HDP) or spin on dielectric (SOD). Subsequently, a chemical mechanical polishing (CMP) process may be performed until a pad nitride layer is exposed, thereby forming the device isolation film.

Figure 4:
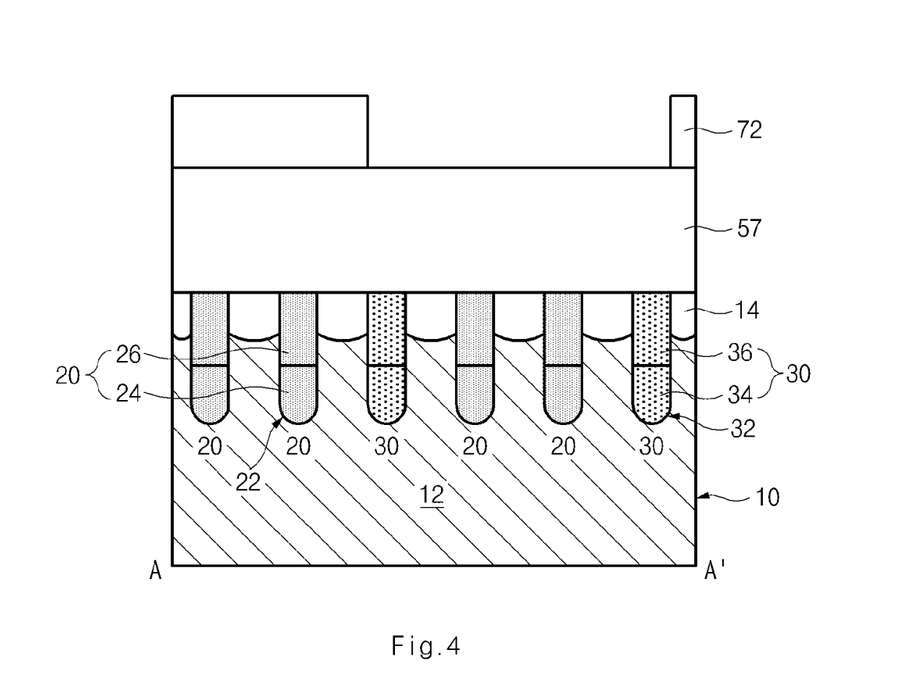

Referring to FIG. 4, a mask pattern 72 is formed over the interlayer dielectric layer 57. The mask pattern 72 may include a photoresist layer pattern or a hard mask pattern. The mask pattern 72 exposes the isolation gates 30 and also exposes, in an alternative, an active region 12 between the isolation gates 30. Specifically, the boundary of the mask pattern 72 may preferably coincide with a left end of the isolation gate 30, disposed at the left of two adjacent isolation gates 30, and at the right end of the isolation gate 30, disposed at the right.

Figure 5:
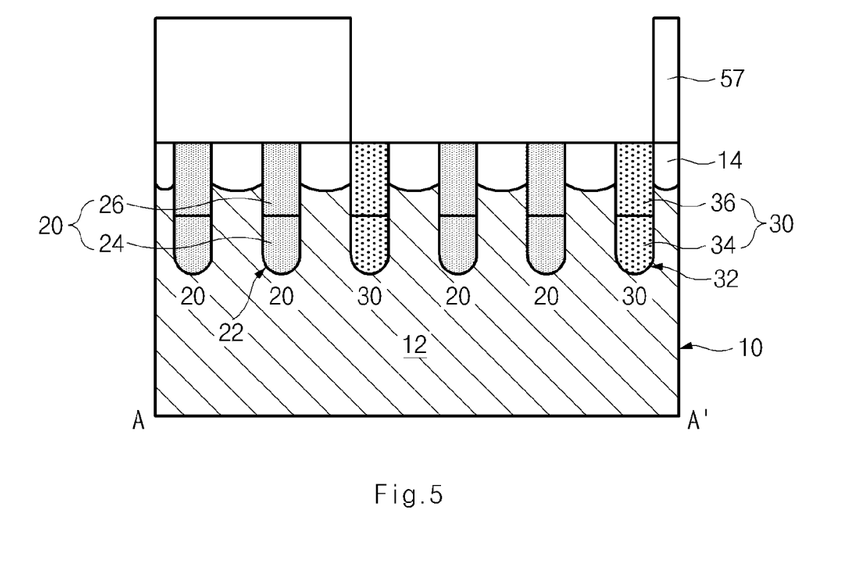

Referring to FIG. 5, the interlayer dielectric layer 57 is etched using the mask pattern 72 as a mask to expose the semiconductor substrate 10. At this time, upper surfaces of two main gates 20 and two isolation gate 30 may be exposed and the boundary of the etched interlayer dielectric layer 57 may also be disposed over the isolation gates.

Figure 6:
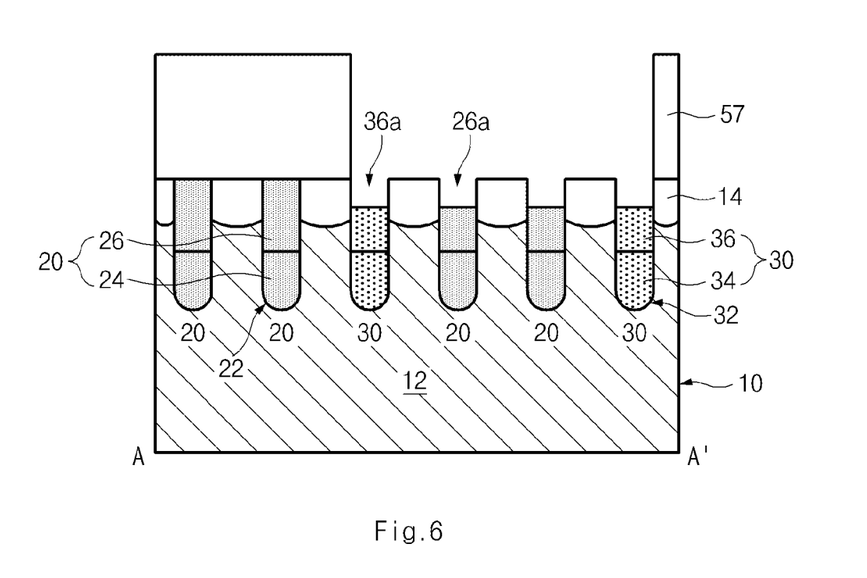

Referring to FIG. 6, an etching process for the capping layers 26 and 36 is performed to partially remove an upper portion of the capping layers 26 and 36. As a result, capping layer recesses 26a and 36a are formed to a predetermined depth in the upper portions of the buried gates 20 and 30. The etching process for the capping layers 26 and 36 may use an etch selectivity between nitride for the capping layer and silicon for the semiconductor substrate 10 and between nitride for the capping layer and oxide for interlayer dielectric layer 57.

Figure 7:
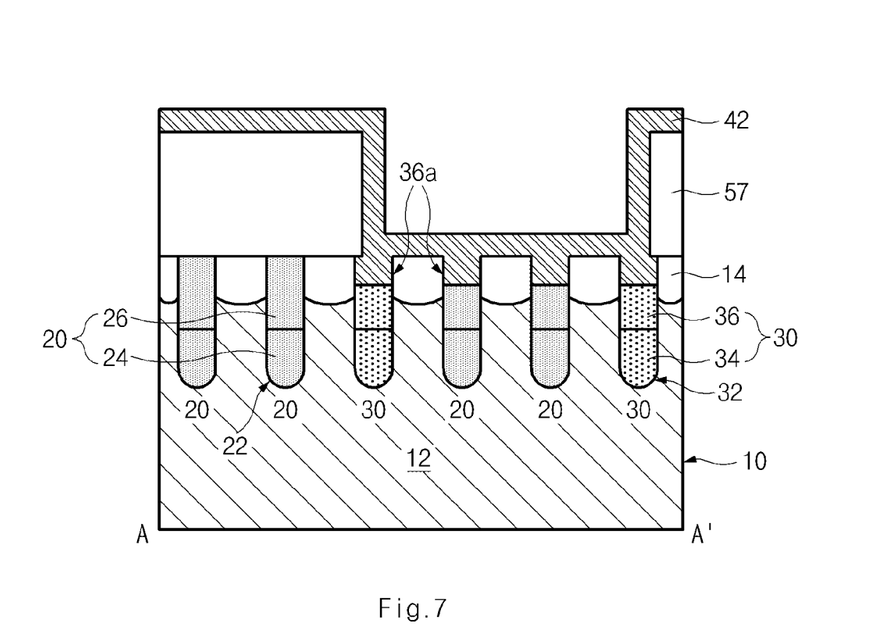

Referring to FIG. 7, an isolation pattern layer 42 is formed to a predetermined thickness over the whole surface of the semiconductor substrate 10 including the capping layer recesses 26a and 36a. The isolation pattern layer 42 may be the isolation pattern 40 to be described later. The isolation pattern layer 42 may include a material having a different etch selectivity from an oxide layer. The isolation pattern layer 42 may include a material such as a nitride layer, a silicon oxynitride layer (SiON) or an amorphous carbon layer. The isolation pattern layer 42 may be deposited using a deposition process such as a physical vapor deposition (PVD) process, a chemical vapor deposition (CVD) process, or an atomic layer deposition (ALD).

Figure 8:
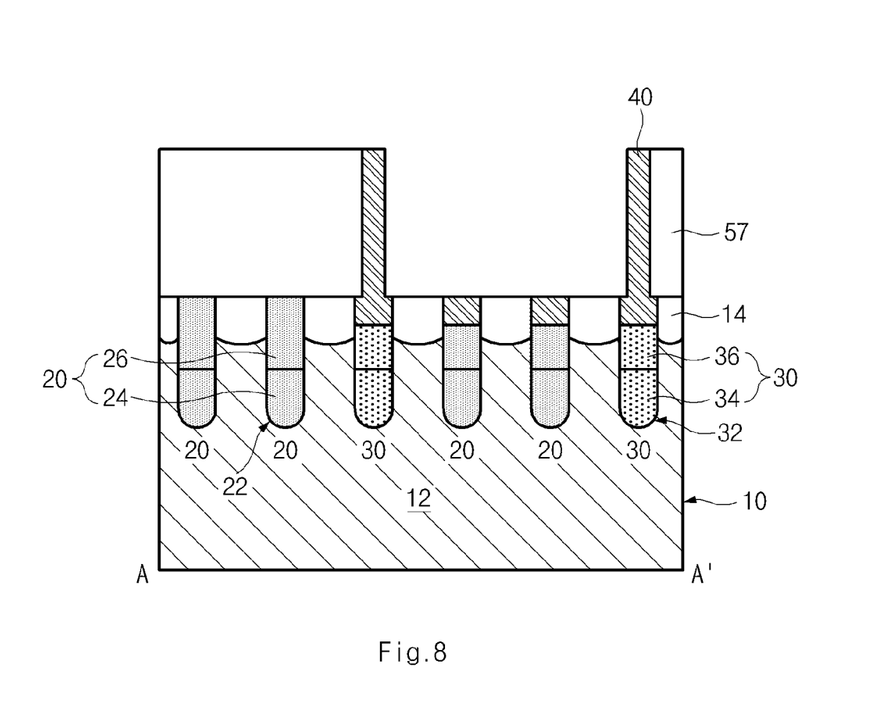

Referring to FIG. 8, an anisotropic etching process for the isolation pattern layer 42 is performed so that the isolation pattern layer 42 remains on sidewalls of the interlayer dielectric layer 57, thereby forming the isolation pattern 40. At this time, since the boundary of the interlayer dielectric layer 57 is disposed over the isolation gates 30, the isolation pattern 40 is also disposed over the boundary of the isolation gates 30. The isolation pattern layer 42 also remains in the capping layer recesses 26a and 36a in the anisotropic etching process. Thereby, the lower portion of the isolation pattern 40 is buried in the capping layer recess 36a so that collapse of the isolation pattern 40 can be prevented in the following process.

Figure 9:
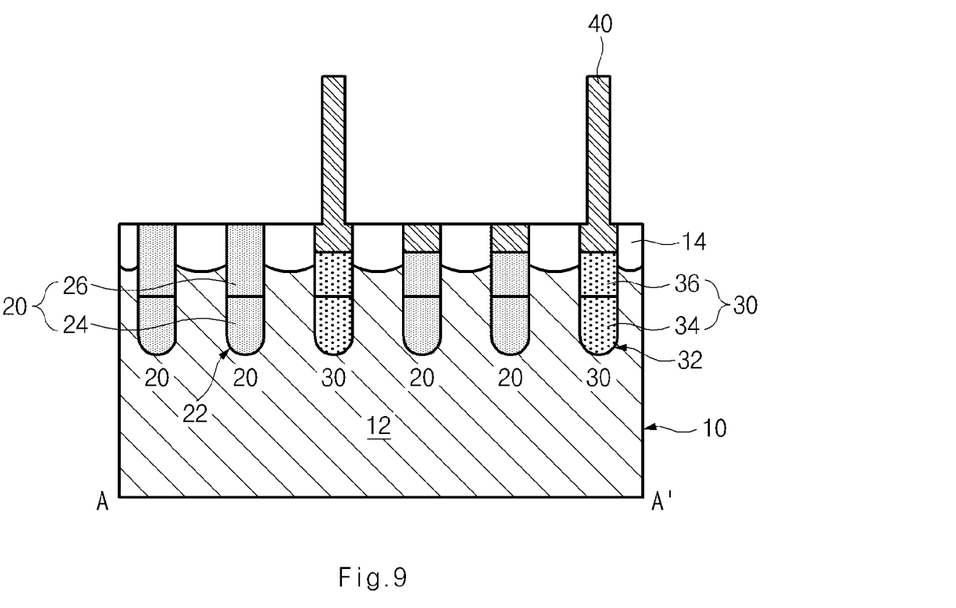

Referring to FIG. 9, the interlayer dielectric layer 57 is removed so that only the isolation pattern 40 is disposed on the semiconductor substrate 10.

Figure 10:
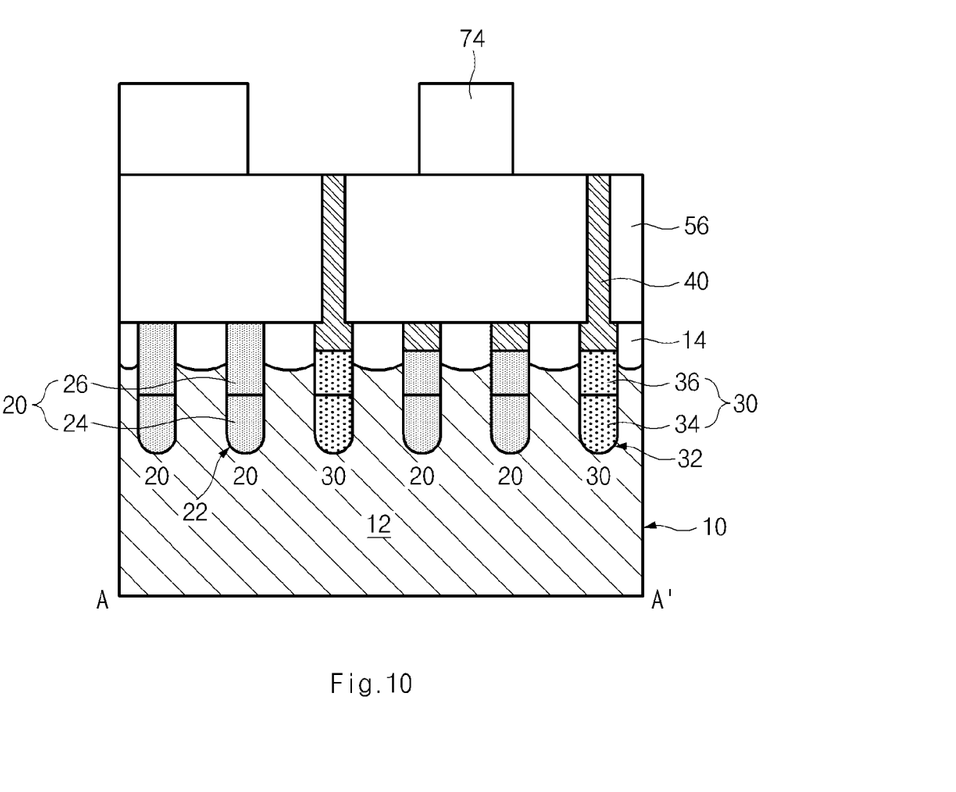

Referring to FIG. 10, an interlayer dielectric layer 56 is deposited on the semiconductor substrate 10, including the isolation pattern 40, so that the whole surface of the semiconductor substrate 10 is planarized. The interlayer dielectric layer 56 may include an oxide layer. A mask pattern 74 of a hard mask material or a photoresist layer is formed over the interlayer dielectric layer 56. The mask pattern 74 may have a configuration for defining a storage node contact region. The mask pattern 74 may have a configuration and a size for defining two adjacent storage node contacts, including one isolation pattern 40.

Figure 11:
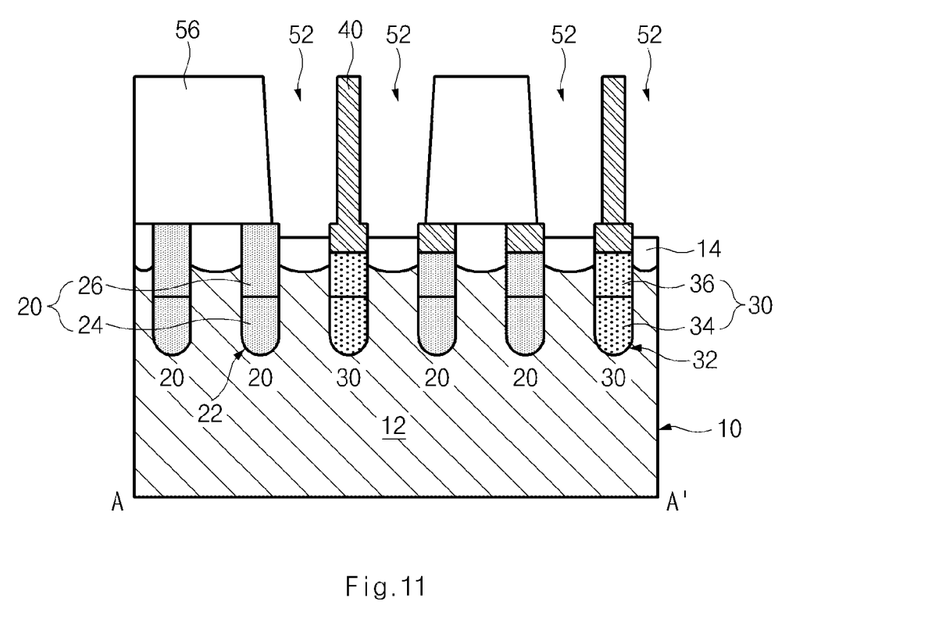

Referring to FIG. 11, the interlayer dielectric layer 56 is etched using the mask pattern 74 as a mask to form storage node contact holes 52. The storage node contact holes 52 may expose the junction region 14 between the isolation gates 30 and the main gates 20. The isolation pattern 40 is disposed at the center of the storage node contact holes 52. The isolation pattern 40 includes a material having a different etch selectivity from the interlayer dielectric layer 56 of an oxide material, such as a nitride layer, a silicon oxynitride (SiON) layer, or an amorphous carbon layer so that the isolation pattern 40 is not etched during the etching process of the interlayer dielectric layer 56.

Figure 12:
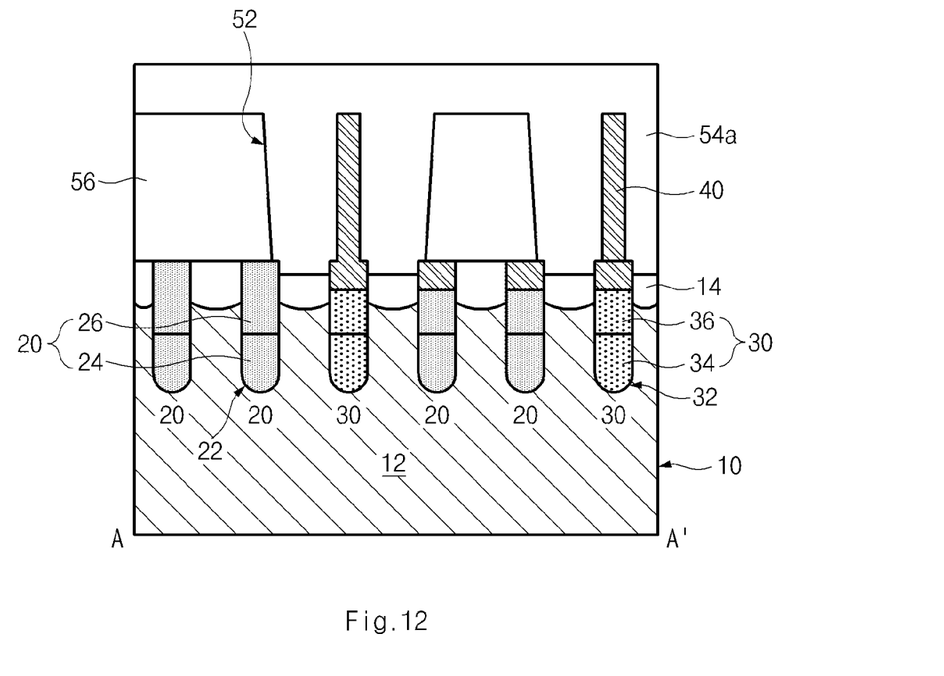

Referring to FIG. 12, a conductive material 54a, such as polysilicon, is deposited over the whole surface of the semiconductor substrate 10, including the storage node contact holes 52, to fill in the storage node contact holes 52.

Figure 13:
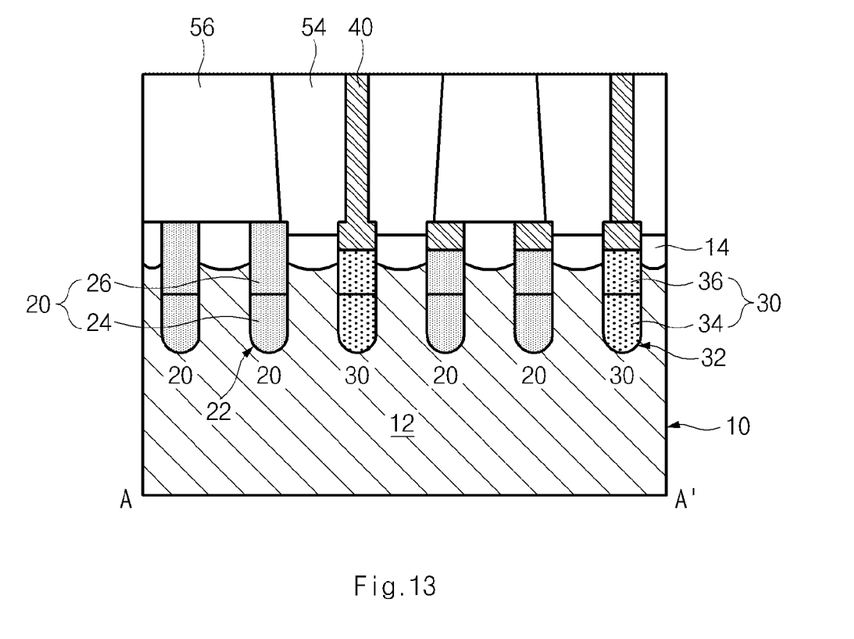

Referring to FIG. 13, an upper portion of the conductive material 54a is planarization-etched using a process such as CMP process to separate the conductive material 54a, thereby forming storage node contact plugs 54 within the storage node contact holes 52.

Referring to FIG. 14, the interlayer dielectric layer 56, in which the storage node contact plugs 54 are formed, is etched and a conductive material is buried within an etched portion of the interlayer dielectric layer 56 to form a bit line contact plug 62. The bit line 60 (see FIG. 2) is formed on the bit line contact plug 62. A capacitor, including a lower electrode, a dielectric layer, and an upper electrode, is formed on the storage node contact plugs 54.

According to the method of manufacturing the semiconductor device having the above configuration according to an exemplary embodiment, two storage node contact plugs 54 are formed by one etching and deposition process using the isolation pattern 40 formed over the isolation gate 30. The isolation pattern 40, previously formed, serves to isolate the storage node contact plugs 54. Thereby, a full overlap between the storage node contact and the active region is provided to solve an overlay in the etching process, and an etching line width of the storage node is increased to improve processing margin.

In the exemplary embodiment, a structure in which the active region 12 (see FIG. 1) is formed in a line type and an isolation gate 30 is included has been described. However, the present invention may also be applied to a semiconductor device in which the active region is formed in a bar type and an isolation gate 30 is not included, as shown in FIG. 15.

Figure 15:
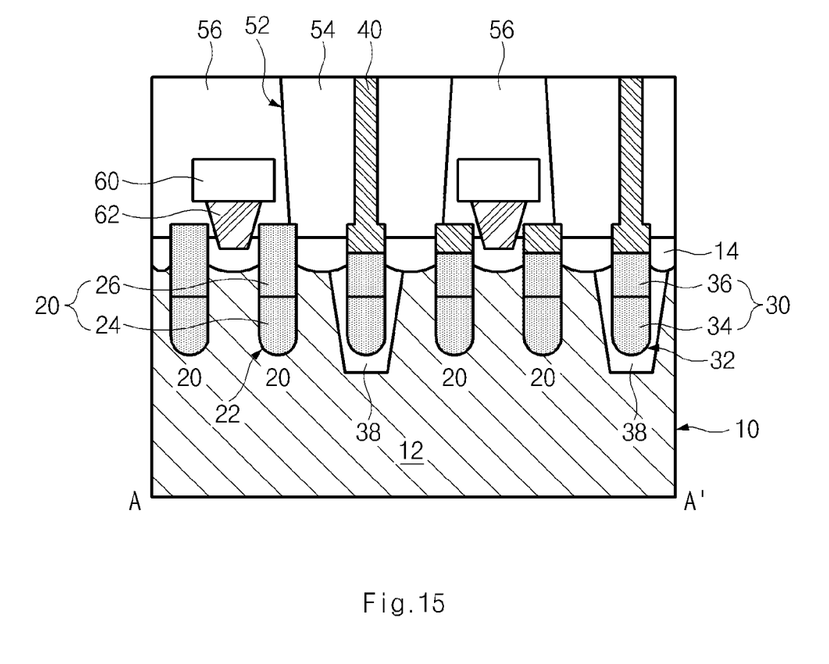
FIG. 15 is a cross-sectional view of a semiconductor device according to another embodiment of the present invention.

FIG. 15 is a diagram illustrating a semiconductor device according to another exemplary embodiment. Referring to FIG. 15, the isolation gate 30 may be omitted and a device isolation film 38 may be formed instead. The device isolation film 38 may be formed in a structure in which an insulating layer is buried within a trench through an STI process. A gate 20 may be formed in the device isolation film 38. An isolation pattern 40 is formed over the device isolation film 38 and storage node contact plugs 54 are formed at sides of the isolation pattern 40.

Even in the semiconductor device according to the exemplary embodiment as described in FIG. 15, two storage node contact plugs 54 are formed by one etching and deposition process using the isolation pattern 40, and the isolation pattern 40 serves to isolate the two storage node contact plugs 54. Thereby, a full overlap between the storage node contact and the active region is provided to solve an overlay in the etching process and an etching line width of the storage node is increased to improve processing tolerance.

The above embodiment of the present invention is illustrative and not limitative. Various alternatives and equivalents are possible. The invention is not limited by the embodiments described herein. Nor is the invention limited to any specific type of semiconductor device. Other additions, subtractions, or modifications are obvious in view of the present disclosure and are intended to fall within the scope of the appended claims.

The present invention includes the following:

15. A method of manufacturing a semiconductor device, comprising:

forming a main gate and a device isolation structure in a semiconductor substrate;

forming an isolation pattern over the device isolation structure; and forming contact plugs at sides of the isolation pattern.

16. The method of claim 15, wherein the forming a device isolation structure includes at least one of:
forming an isolation gate disposed to be adjacent to the main gate in a semiconductor substrate; and
forming a device isolation film including an insulating layer buried in a trench formed in the semiconductor substrate.

17. The method of claim 15, wherein the forming an isolation pattern includes:
forming an interlayer dielectric layer over the semiconductor substrate;
etching the interlayer dielectric layer to form an etched interlayer dielectric layer exposing two neighboring isolation gates and the substrate between the two neighboring isolation gates;
depositing an isolation pattern layer over the whole surface of the semiconductor substrate including the etched interlayer dielectric layer;
etching back the isolation pattern layer so that the isolation pattern remains over a sidewall of the interlayer dielectric layer; and
removing the etched interlayer dielectric layer.

18. The method of claim 16, wherein the forming a main gate and an isolation gate includes:
forming recesses having a predetermined depth in the semiconductor substrate;
burying a gate conductive layer in a lower portion of the recesses; and
burying a capping layer over the gate conductive layer within the recesses.

19. The method of claim 18, wherein the isolation pattern is formed so that a lower portion of the isolation pattern is buried within an upper portion of the recess.

20. The method of claim 19, the step of forming the isolation pattern further comprising:
etching the capping layer to a predetermined depth; and
forming the isolation pattern layer over the semiconductor substrate including an etched capping layer.

21. The method of claim 15, wherein the step of forming the contact plug includes:
forming an interlayer insulating layer over the semiconductor substrate including the isolation pattern;
etching the interlayer insulating layer to expose the substrate between the main gate and the device isolation structure to form a contact hole;
depositing a conductive material over the whole surface of the semiconductor substrate including the contact hole; and
planarization-etching the conductive material over the interlayer insulating layer.

22. The method of claim 15, wherein the isolation pattern includes an insulating layer having a different etch selectivity from an oxide layer, and includes any of a silicon nitride layer, a silicon oxynitride layer and an amorphous carbon layer.

23. The method of claim 16, wherein the step of forming the main gate and the isolation gate includes forming two main gates and one isolation gate to be disposed repeatedly.

24. The method of claim 15, the method further comprising:
forming a bit line contact over a bit line contact region between the two main gates; and
forming a bit line over the bit line contact.

25. The method of claim 15, wherein any of the contact plugs is a storage node contact plug.

26. A method of manufacturing a semiconductor device, comprising:
forming an active region of a line type in a semiconductor substrate;
forming a main gate and an isolation gate each passing the active region;
forming an isolation pattern of a line type over the isolation gate; and
forming a first contact plug formed at a side of the isolation pattern.

27. The method of claim 26, wherein the forming the main gate and the isolation gate includes forming two main gates and one isolation gate to be repeatedly disposed.

28. The method of claim 27, the method further comprising forming a second contact plug between the two main gates.

29. The method of claim 27, further comprising forming a bit line of a line type disposed over the second contact plug to be coupled to the bit line contact plug.

30. The method of claim 29, wherein the bit line is arranged perpendicular to the main gate.

31. The method of claim 26, wherein the first contact plug includes a storage node contact plug.

What is claimed is:
1. A semiconductor device, comprising:
first and second main gates disposed in a semiconductor substrate;
a device isolation structure buried in a recess formed in the semiconductor substrate, the device isolation structure being arranged between the first and second main gates;
an isolation pattern disposed over the device isolation structure; and
contact plugs disposed at sides of the isolation pattern, each of the contact plugs disposed between the isolation pattern and a corresponding one of the first and the second main gates,
wherein the isolation pattern is formed so that a lower portion of the isolation pattern is buried within an upper portion of the recess to prevent the isolation pattern from collapsing, and a horizontal cross-sectional area of the lower portion of the isolation pattern is greater than that of an upper portion of the isolation pattern.

2. The semiconductor device of claim 1, wherein the device isolation structure includes at least one of:
an isolation gate disposed adjacent to the first and second main gates in the semiconductor substrate; and
a device isolation film including an insulating layer buried within a trench formed in the semiconductor substrate.

3. The semiconductor device of claim 2, wherein each of the first and second main gates includes:
a recess having a predetermined depth formed in the semiconductor substrate;
a gate conductive layer buried in a lower portion of the recess; and
a capping layer formed over the gate conductive layer within the recess.

4. The semiconductor device of claim 2, wherein the isolation gate includes:
a gate conductivity layer buried in a lower portion of the recess; and
a capping layer formed over the gate conductive layer within the recess.

5. The semiconductor device of claim 2, wherein a plurality of main gates including the first and second main gates and a plurality of isolation gates including the isolation gate are formed such that a pair of main gates of the plurality of main gates and one isolation gate of the plurality of isolation gates are repeatedly disposed.

6. The semiconductor device of claim 5, wherein the plurality of main gates further includes a third main gate disposed adjacent to the first main gate, the device further comprising:

a bit line contact disposed over a bit line contact region between the first and third main gates; and a bit line disposed over the bit line contact.

7. The semiconductor device of claim 1, wherein the isolation pattern includes an insulating layer having a different etch selectivity from an oxide layer, and wherein the isolation pattern includes any of a nitride layer, a silicon oxynitride layer and an amorphous carbon layer.

8. The semiconductor device of claim 1, wherein any of the contact plugs is a storage node contact plug.

9. A semiconductor device, comprising:

an active region formed in a line type in a semiconductor substrate;

first and second main gates and an isolation gate passing the active region, the isolation gate being buried within a recess and disposed between the first and the second main gates;

an isolation pattern of a line type disposed over the isolation gate; and contact plugs each extending along the isolation pattern and disposed between the isolation pattern and a corresponding one of the first and the second main gates, wherein the isolation pattern is formed so that a lower portion of the isolation pattern is buried within an upper portion of the recess to prevent the isolation pattern from collapsing, and a horizontal cross-sectional area of the lower portion of the isolation pattern is greater than that of an upper portion of the isolation pattern.

10. The semiconductor device of claim 9, wherein a plurality of main gates including the first and second main gates and a plurality of isolation gates including the isolation gate are formed such that a pair of main gates of the plurality of main gates and one isolation gate of the plurality of isolation gates are repeatedly disposed.

11. The semiconductor device of claim 10, wherein the plurality of main gates further includes a third main gate disposed adjacent to the first main gate, the device further comprising a bit line contact plug between the first and third main gates.

12. The semiconductor device of claim 11, further comprising a bit line of a line type disposed over the bit line contact plug and extending across the first and second main gates.

13. The semiconductor device of claim 12, wherein the bit line perpendicularly passes across the first and second main gates.

14. The semiconductor device of claim 9, wherein any of the contact plugs is a storage node contact plug.

\* \* \* \* \*